US00RE34899E

United States Patent [19]

Gessaman et al.

[11] E Patent Number: Re. 34,899

[45] Reissued Date of Patent: Apr. 11, 1995

[54] ANALOG TO DIGITAL CONVERSION WITH CHARGE BALANCED VOLTAGE TO FREQUENCY CONVERTER HAVING POLARITY RESPONSIVE OFFSET

[75] Inventors: William K. Gessaman, Everett; Paul R. Lantz; Jonathan J. Parle, both of Seattle, all of Wash.

[73] Assignee: John Fluke Mfg. Co., Inc., Everett, Wash.

[21] Appl. No.: 194,896

[22] Filed: Feb. 14, 1994

Related U.S. Patent Documents

Reissue of:

[64] Patent No.: 4,942,401
Issued: Jul. 17, 1990
Appl. No.: 314,904
Filed: Feb. 24, 1989

[51] Int. Cl.[6] ..... H03M 1/60

[52] U.S. Cl. ..... 341/157; 341/129; 341/168; 324/99 D; 320/1; 327/101

[58] Field of Search ..... 341/127, 128, 129, 157, 341/166, 167, 168; 324/99 D; 328/150, 151; 320/1

[56] References Cited

U.S. PATENT DOCUMENTS

| | | | |
|---|---|---|---|
| 3,713,136 | 1/1973 | Nagy, Jr. | 341/167 |
| 3,878,534 | 4/1975 | Horowitz et al. | 341/128 |
| 3,909,824 | 9/1975 | Fontanes | 341/166 |
| 4,031,532 | 6/1977 | First | 341/157 |
| 4,082,998 | 4/1978 | Marriott | 341/128 |
| 4,190,823 | 2/1980 | Leichle | 341/127 |
| 4,268,820 | 5/1981 | Hareyama | 324/99 D |
| 4,337,456 | 6/1982 | Deffendall et al. | 341/167 |
| 4,366,468 | 12/1982 | Yoneyama | 341/157 |
| 4,598,270 | 7/1986 | Shutt et al. | 341/166 |
| 4,772,843 | 9/1988 | Asaka et al. | 320/1 |

*Primary Examiner*—Howard L. Williams

[57] ABSTRACT

A bipolar analog voltage is converted into a digital signal by sensing the polarity of the voltage and selectively supplying a bias voltage to an analog-to-digital converter, which can preferably be a charge balanced voltage to frequency converter, as a function of the sensed polarity. The voltage to frequency converter has a double valued variable frequency output with a discontinuity at zero volt such that the converter derives a maximum output frequency for a maximum positive voltage and also for a negative value slightly displaced from zero; the voltage to the frequency converter minimum output frequency is derived from positive voltages slightly greater than zero and for maximum negative voltages. The converter output frequency and the sensed polarity are supplied to a frequency to digital converter which derives an output signal having a bit representing the polarity of the analog voltage and additional bits indicative of the magnitude of the analog voltage.

13 Claims, 4 Drawing Sheets

ANALOG TO DIGITAL CONVERSION WITH CHARGE BALANCED VOLTAGE TO FREQUENCY CONVERTER HAVING POLARITY RESPONSIVE OFFSET

Matter enclosed in heavy brackets [ ] appears in the original patent but forms no part of this reissue specification; matter printed in italics indicates the additions made by reissue.

FIELD OF INVENTION

The present invention relates generally to analog to digital converters and more particularly to an analog to digital converter that is made to be responsive to bipolar input voltages by means of a bias voltage coupled to the input of the converter. The invention has particular application to charge balanced voltage-to-frequency converters.

BACKGROUND ART

Among the useful attributes of charge balanced voltage-to-frequency converters is the fact that they can be used to implement analog-to-digital converters. Charge balanced voltage-to-frequency converters generally include a capacitor, connected with an operational amplifier to form a current integrator, that is cyclically charged, first, in one direction and, second, in the opposite direction (i.e., charged and discharged). This is done at a frequency which changes linearly with the input voltage applied. The net charge applied to the capacitor during each cycle is zero, a result achieved by charging the capacitor in the first direction for a predetermined time. In response to the end of that time, the capacitor is charged in the second (opposite) direction until a predetermined level is reached. The rate at which the capacitor is charged in the first direction is controlled by the sum of a current derived from the input voltage and a fixed current source. The rate at which the capacitor is charged in the second direction is determined by a current derived from the input voltage. Therefore, the frequency of the charge and discharge cycles is a direct function of the input voltage magnitude.

Among the well known advantages of charge balanced voltage-to-frequency converters are: (1) the inherent filtering provided by the capacitor which is connected to and responsive to the input during the entire charge/discharge cycle, and (2) the fact that this eliminates the need for an anti-aliassing filter in systems where one is digitizing the input in discrete samples.

Several different techniques have been employed for enabling charge balanced voltage-to-frequency converters to handle bipolar input voltages. One prior art bipolar charge balanced voltage-to-frequency converter includes an absolute value circuit connected between the voltage source and the charge balanced converter circuit. In an idealized situation a converter with an absolute value circuit responds to input voltages of −10 volts, 0 volt and +10 volts to derive frequencies of (for example) 100 kHz, 10 kHz and 100 kHz, respectively The negative voltage levels are detected to control a polarity bit which is combined with the counted frequency, containing the magnitude information, to determine the complete reading. However, the absolute value circuit has a tendency to have slightly different gain factors for positive voltages relative to negative voltages. The different gain factors of the absolute value circuit introduce errors in the voltage versus frequency relationship of the converter so that, in the above example, the derived frequencies may be 100 kHz, 10 kHz and 99 kHz. Further, absolute value circuits with even the above inaccuracy generally require the use of high accuracy operational amplifiers which are slow to settle. The settling time required for a circuit combined with the preamplifier ahead of the voltage to frequency converter can easily be 100 microseconds. This could be shortened greatly by implementing the absolute value circuit after the preamplifier, but at the expense of added parts, hence added cost and error.

Another bipolar charge balanced voltage-to-frequency converter provides a bias to the converter, such that a zero voltage input is offset to a predetermined value at the input of the converter. The maximum negative and positive voltages applied to such converters result in the converter deriving minimum and maximum frequencies, respectively, while a zero input voltage results in the converter deriving a median output frequency. For example, the bias applied to such a converter causes the converter response to be 10 kHz, 55 kHz and 100 kHz, respectively, for input voltages of −10 volts, volt and +10 volts. Such converters have the advantage of simplicity over converters which use an absolute value circuit, but they sacrifice one bit of resolution when compared to unipolar converters or those which use an absolute value circuit. This lost bit of resolution means that such converters have only one-half the resolution that the other converters have. Thus, the accuracy of prior art converters using a built in bias is reduced considerably.

A third prior art bipolar charge balanced converter includes a pair of converters, one for positive voltages and a second for negative voltages. Such a construction is disadvantageous because of the doubled cost of two converters and the difficulties in obtaining two converters having exactly the same responses to voltages of the same amplitude but of opposite polarity.

It is, accordingly, an object of the present invention to provide a new and improved bipolar charge balanced voltage-to-frequency converter.

Another object of the invention is to provide a new and improved, high accuracy, high resolution charge balanced voltage-to-frequency converter.

Another object of the present invention is to provide a new and improved, relatively inexpensive and highly accurate charge balanced voltage-to-frequency converter.

DISCLOSURE OF THE INVENTION

In accordance with the present invention a charge balanced voltage-to-frequency converter responsive to bipolar voltages senses the polarity of the input voltage and selectively connects a bias current derived from a bias voltage to an input of the charge balanced converter as a function of the sensed polarity. The bias current which is selectively applied as a function of the polarity of the input voltage being converted has a polarity opposite that of a constant current source applied to the converter periodically to balance the charge applied to a capacitor.

In a preferred embodiment of the invention, a circuit for converting a voltage having positive and negative (opposite) polarities to an output frequency that is related to the value of the voltage and wherein the voltage magnitude can include zero, comprises a capacitor connected to the inverting input of an operational amplifier to implement an integrator. The input voltage, and all other voltages used, are applied to the integrator through resistors which effectively turn them into current sources charging or discharging the capacitor while the operational amplifier holds the voltage of its inverting input terminal at a constant voltage that is very near ground potential. In response to the input voltage having a positive polarity the capacitor is cyclically charged and discharged, i.e., charged in a first direction and then in a second, opposite, direction at a first rate determined by a constant current source and a current derived from the input voltage and at a second rate determined by a current derived from the input voltage, so that zero net charge is applied to the capacitor during each cycle. While the input voltage has a negative polarity, the capacitor is charged at a third rate, determined by the sum of a current derived from the input voltage and a current derived from an offsetting voltage source and a constant current source, and discharged at a fourth rate, determined by a current derived from the input voltage, and a current derived from the offsetting voltage. The variable capacitor charge rates determine the frequency of a triangular-like wave derived from the converter. The frequency of the triangular-like wave is counted and used in combination with the sensed polarity to derive an accurate indication of the voltage magnitude and polarity.

The input voltage magnitude versus output frequency relationship of the converter is monotonic for each polarity. However, the input voltage magnitude versus output frequency is double valued when both polarities are considered, i.e., the output frequency has the same value for one positive voltage as for one negative voltage. This increases the input voltage to output frequency resolution of the converter by a factor of two. Accordingly, greater accuracy is achieved without the inherent disadvantage of an absolute value circuit and without the need for duplicated converters for the two polarities, merely by properly setting the magnitude of a bias voltage which is applied to the converter as a function of input voltage polarity.

In the preferred embodiment, there is a step function change in output frequency for input voltage in the vicinity of zero volt. This is achieved by simply switching an offsetting current derived from an offsetting voltage source in or out of the circuit. This is highly advantageous because the percentage error in the vicinity of zero volt is kept small, which is not the case in other implementations of bipolar voltage-to-frequency converters. In the preferred embodiment, for voltages varying between zero and +Vmax the converter output frequency varies from F1 to F2, where F1 is less than F2 and is preferably not zero because of the need to obtain an accurate count of it within a short time, i.e. in practice less than 500 microseconds. For input voltage between zero and −V, the output frequency varies from F2 to F1.

In accordance with another invention a bipolar analog to digital converter comprises a polarity sensor responsive to the analog voltage and a voltage-to-frequency converter responsive to the sensed polarity and the analog signal for deriving a variable frequency signal having two frequency values as a function of the polarity of the analog signal. There is a discontinuity in the frequency derived by the voltage-to-frequency converter as the analog signal changes polarity A frequency to digital converter responds to the variable frequency output of the voltage-to-frequency converter and to the polarity sensor for deriving a binary representation having a polarity bit indicative of the sensed polarity and remaining bits controlled by the frequency derived by the voltage to frequency converter and the sensed polarity.

It is, accordingly, still another objective of the invention to provide a new and improved analog-to-digital converter employing a charge balanced voltage-to-frequency converter responsive to bipolar input voltages.

A further objective of the invention is to provide a new and improved bipolar analog-to-digital converter that is highly accurate and sensitive to voltage variations in the vicinity of zero volt.

A further objective of the present invention is to implement an analog-to-digital converter which can maintain a high level of accuracy and resolution while requiring only a short time to sample the input.

The above and still further objects, features and advantages of the present invention will become apparent upon consideration of the following detailed description of one specific embodiment thereof, especially when taken in conjunction with the accompanying drawings.

DETAILED DISCLOSURE OF THE INVENTION

Figure 1:
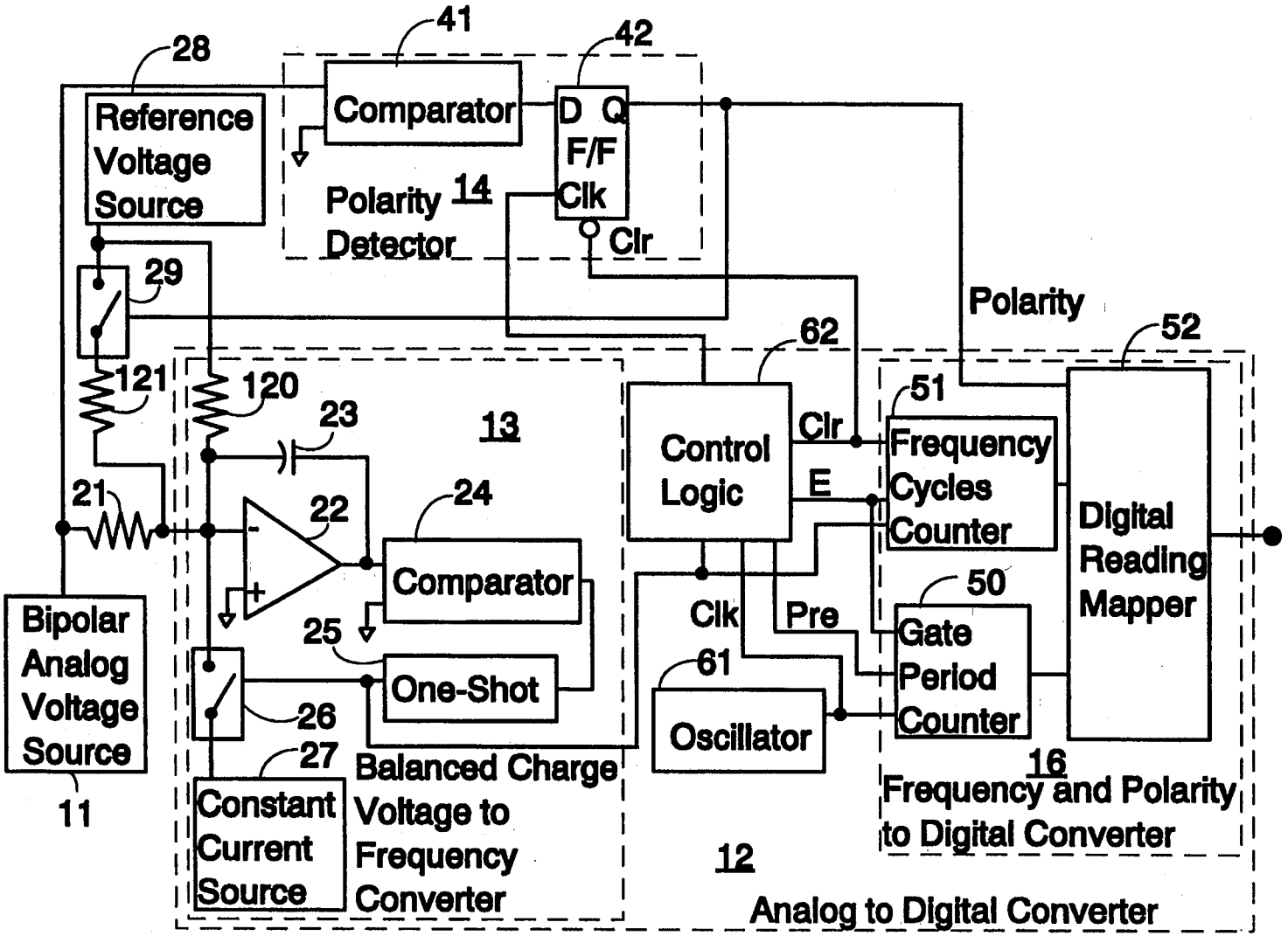
FIG. 1 is a circuit diagram of an analog-to-digital converter employing a charge balanced voltage-to-frequency converter in accordance with the present invention.

Reference is now made to FIG. 1, wherein bipolar analog voltage source 11 generates an output that is connected to an input of an analog-to-digital converter 12 including charge balanced voltage-to-frequency converter 13, polarity detector 14, control logic network 15 and frequency and polarity to digital converter 16. Polarity detector 14 is connected directly to the output of source 11 to derive a binary signal indicative of the polarity of the voltage present at the input.

Charge balanced voltage-to-frequency converter 13 responds directly to the output of the source 11 and to the polarity indicating signal derived from the detector 14 to derive a triangular wave output having linear variations such that in response to the voltage of source 11 having a positive polarity the converter derives a waveform the frequency of which increases linearly with increasing input voltage from source 11; in response to negative polarity voltages from source 11 the converter derives a waveform the frequency of which decreases linearly with increasing magnitude of input voltage from source 11. Reference voltage source 28 and resistor 120 provide a constant bias current to the input of the converter which ensures that the minimum slope of the waveforms, and hence the minimum frequency of the converter, is always greater than zero, preferably, near 10 kHz. Comparator 24 and one-shot multivibrator 25 respond to the triangular wave to generate output pulses having a frequency equal to the triangular wave frequency. Frequency and polarity to digital converter 16 responds to variable frequency and polarity input signals to derive a digital representation having a polarity bit representing the polarity of source 11 and additional bits representing the magnitude of the voltage of the source 11. Control logic circuit 62 supplies signals to polarity detector 14 and converter 16 to control the operation thereof.

Charge balanced voltage-to-frequency converter 13 includes an analog integrator comprising resistor 21, operational amplifier 22 and feedback capacitor 23. Resistor 21 is connected between an output terminal of voltage source 11 and the inverting input terminal of amplifier 22, while capacitor 23 is connected between an output terminal of the amplifier and the inverting input terminal of the amplifier. The output of operational amplifier 22 is applied to an input of comparator 24, having a second, grounded input whereby the comparator derives a positive voltage signal in response to the output of amplifier 22 being equal to or less than zero. At all other times comparator 24 derives a zero output voltage.

The signal derived by comparator 24 is applied to the input of a monostable multivibrator (one-shot flip-flop) 25, whereby the one-shot derives a bilevel output signal having a binary one positive level for a predetermined interval of time after comparator 24 supplies it with a positive transition. At all other times, the output of one-shot 25 is a binary zero, ground level. The output of one-shot 25 is supplied as a control input to switch 26 so that the switch is opened and closed while binary zero and one levels are respectively derived from one-shot 25. Switch 26 is connected in series between the output of a negative constant current source 27 and the inverting input terminal of operational amplifier 22.

In response to a positive output voltage from voltage source 11, capacitor 23 is cyclically charged and discharged at first and second predetermined rates, where the first rate is determined by the sum of the currents caused by the voltage from source 11, applied across resistor 21, and the constant current from source 27 (while switch 26 is closed). The second rate is determined only by the voltage from source 11 applied across resistor 21. While switch 26 is closed, the net current applied to the inverting input of amplifier 22 is negative based on the selection of constant current source 27 to have a magnitude greater than or equal to the maximum current from source 11 applied across resistor 21.

In response to the net negative current supplied to the inverting input terminal of amplifier 22 from sources 11 and 27, the amplifier derives a positive going, linear ramp output voltage by virtue of capacitor 23 being charged by the output of amplifier 22. The positive going linear ramp is maintained for a predetermined time interval, determined by the duration of the binary one output of one-shot 25, which in turn determines the length of time switch 26 is closed.

In response to the output of one-shot 25 returning to the binary zero level, switch 26 is opened, causing a positive net current to be supplied by source 11 through resistor 21 to the inverting input of amplifier 22. The net positive current applied to the inverting input of amplifier 22 is inverted by the amplifier into a negative voltage ramp at its output that decreases linearly by virtue of capacitor 23 being discharged. In response to the negative going voltage at the output of amplifier 22 reaching a zero level, comparator 24 derives a positive output transition which triggers one-shot 25, causing the one-shot to derive a binary one level for the previously mentioned predetermined interval to define the next cycle. The triangular wave voltage at the output of amplifier 22 thus has a variable frequency determined by the magnitude of voltage source 11.

From the foregoing, the charge applied to and removed from capacitor 23 during each operating cycle has a net value of zero, leading to the name "charge balanced voltage-to-frequency converter". While switch 26 is open, the only input current supplied to the inverting input terminal of amplifier 22 is from source 11, through resistor 21. Thus the only variable affecting the charge and discharge rates of capacitor 23 and thereby the slopes of the output of amplifier 22 during the charge and discharge times of the capacitor are indicative of the voltage of source 11 while source 11 has a positive value.

The previously described elements of charge balanced voltage-to-frequency converter 13 are well known, as is the operation thereof. In accordance with the present invention, the charging rate of capacitor 23 is modified by connecting a positive reference voltage source 28 to the inverting input of amplifier 22 through resistor 121 when the voltage from source 11 is negative. Such a modification enables charge balanced voltage-to-frequency converter 13 to operate over the same range as if it were responding to voltages of only positive polarity from source 11. The magnitude of the current supplied to the inverting input terminal of amplifier 22 while the polarity of source 11 is negative is determined by setting the value of resistor 121 to equal the value of resistor 21 and the voltage magnitude of reference voltage source 28 to equal Vmax, where Vmax equals the maximum voltage of source 11. Setting R121=R21 and Vref=Vmax is not fundamental to the invention, although implementation is simplified thereby. Selection of the magnitude of the current supplied by the reference voltage source 28 while the voltage of source 11 is negative to correspond to Vmax ensures that capacitor 23 is cyclically charged and discharged in the same manner and at the same rates for negative voltages from source 11 as it would be for positive voltages from the source 11.

To these ends, charge balanced voltage-to-frequency converter 13 is in circuit with reference voltage source 28, resistor 121 and switch 29 connected between the output of source 28 and one end of resistor 121. The other end of resistor 121 is connected to the inverting input terminal of amplifier 22. Source 28 provides a constant current output through resistor R121 based on the ability of amplifier 22 to hold its inverting input terminal at a constant voltage, very near ground potential, by supplying current to that terminal through capacitor 23. The sum of the currents from source 11 and reference voltage source 28 never exceeds Vmax/R21 because voltage source 28 is applied only when voltage source 11 derives a negative value. Therefore the operation of the voltage-to-frequency converter with negative voltages applied from source 11 and with reference voltage source 28 applied through resistor 121 is substantially the same as its operation with positive voltages applied from voltage source 11 without reference voltage source 28 applied. However, it is important to recall that the application of reference voltage source 28 does not attempt to invert the voltage-to-frequency characteristic as an absolute value circuit would, but rather offsets the characteristic. It is also important to note that applying offsetting reference voltage source 28 does not cause the amplifier 22 input voltage or output voltage to change, which would require significant settling time, e.g., up to 100 microseconds for a 1 MHz amplifier. Rather, it causes a change in the rate at which the output voltage of the amplifier 22 changes, which takes place in a much shorter time, e.g., on the order of 1 microsecond for a 1 MHz amplifier.

While switch 29 is closed in response to a negative output voltage from source 11, and while switch 26 is closed in response to a binary one output level of one-shot 25, capacitor 23 is charged, resulting in a positive going linear voltage ramp being derived at the output of operational amplifier 22. In response to switch 26 being opened at the end of the predetermined time interval for the binary one output of one-shot 25 being completed, only the negative current supplied from source 11 through resistor 21 and the positive current of source 28, coupled through switch 29 and resistor 121, flow into the inverting input terminal of amplifier 22, resulting in a negative going output linear voltage ramp at the output terminal of the amplifier 22. When the negative going output voltage reaches a zero level, comparator 24 triggers one-shot 25, completing the cycle.

Figure 2:
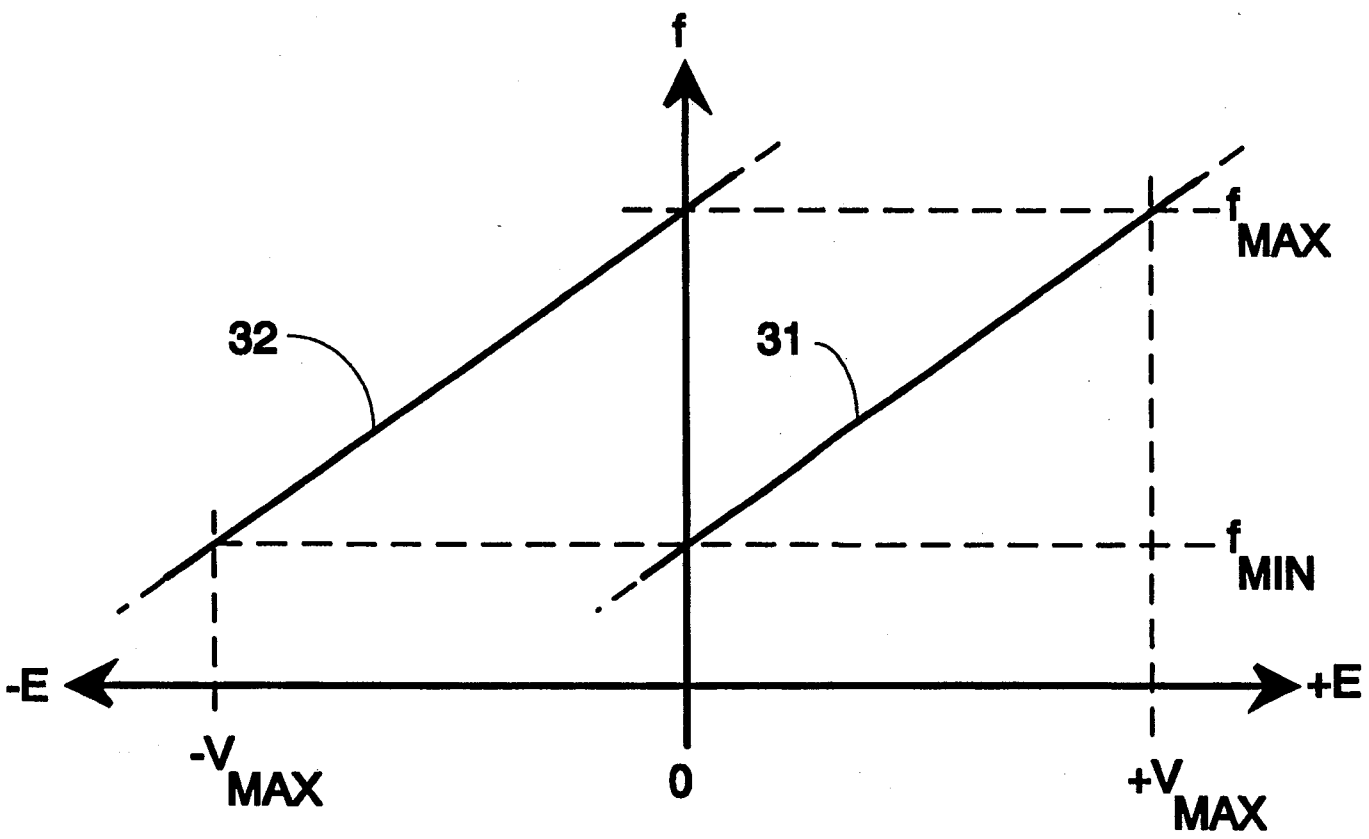
FIG. 2 is a drawing of the input voltage-output frequency response of the charge balanced voltage-to-frequency converter employed in the analog-to-digital converter of FIG. 1.

For a given magnitude of voltage source 11, the charge and discharge rates of capacitor 23 may differ. They combine to form a triangular wave form which has a frequency that corresponds to that voltage value from source 11 and causes one-shot 25 to output pulses at that same frequency. The relationship between the output frequency of voltage-to-frequency converter 13 and the magnitude and polarity of the voltage from source 11 is illustrated in FIG. 2. Therein, as the voltage of source 11 increases from zero volt in a positive direction to the maximum value of +Vmax, the frequency derived from voltage-to-frequency converter 13 increases in a linear, monotonic manner from fmin to fmax, as indicated by straight line 31. In response to the voltage of source 11 increasing from zero volt to −Vmax, the output frequency of voltage-to-frequency converter 13 decreases in a linear, monotonic manner from fmax to fmin, as indicated by straight line 32. In a typical example, the values of fmin and fmax are respectively 10 kHz and 100 kHz, while the value of Vmax is 10 volts. In any event, the value of fmin is deliberately maintained greater than zero by the offset current that flows from reference voltage source 28 through resistor 120 into the inverting input of the operational amplifier 22.

From the foregoing, it is apparent that there is a significant, finite jump in the output frequency of voltage-to-frequency converter 13 in the vicinity of zero volt, as a function of the polarity of the voltage derived by source 11, sensed by polarity detector 14.

Figure 3A:
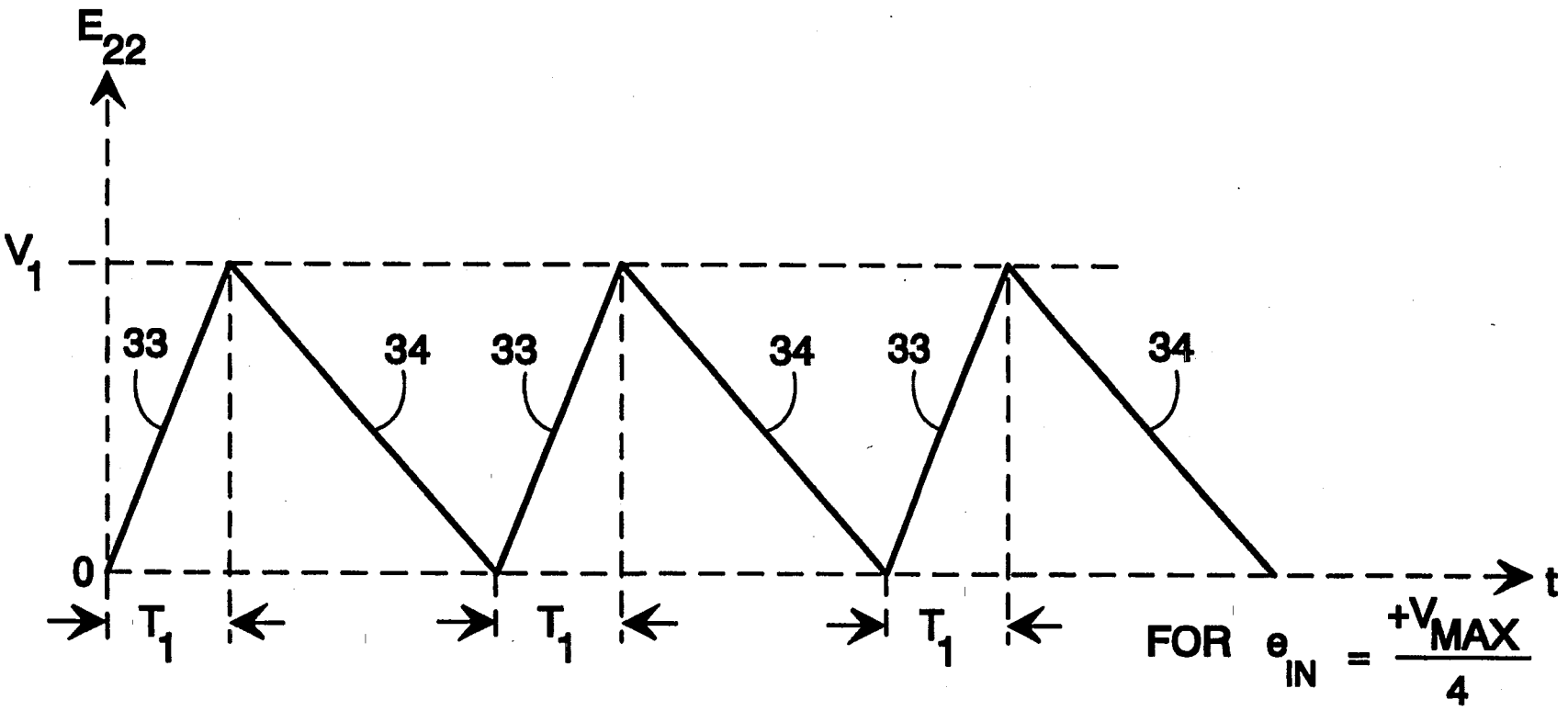
FIGS. 3(a) and 3(b) are a series of waveforms helpful in analyzing the operation of the circuit of FIG. 1.
Figure 3B:
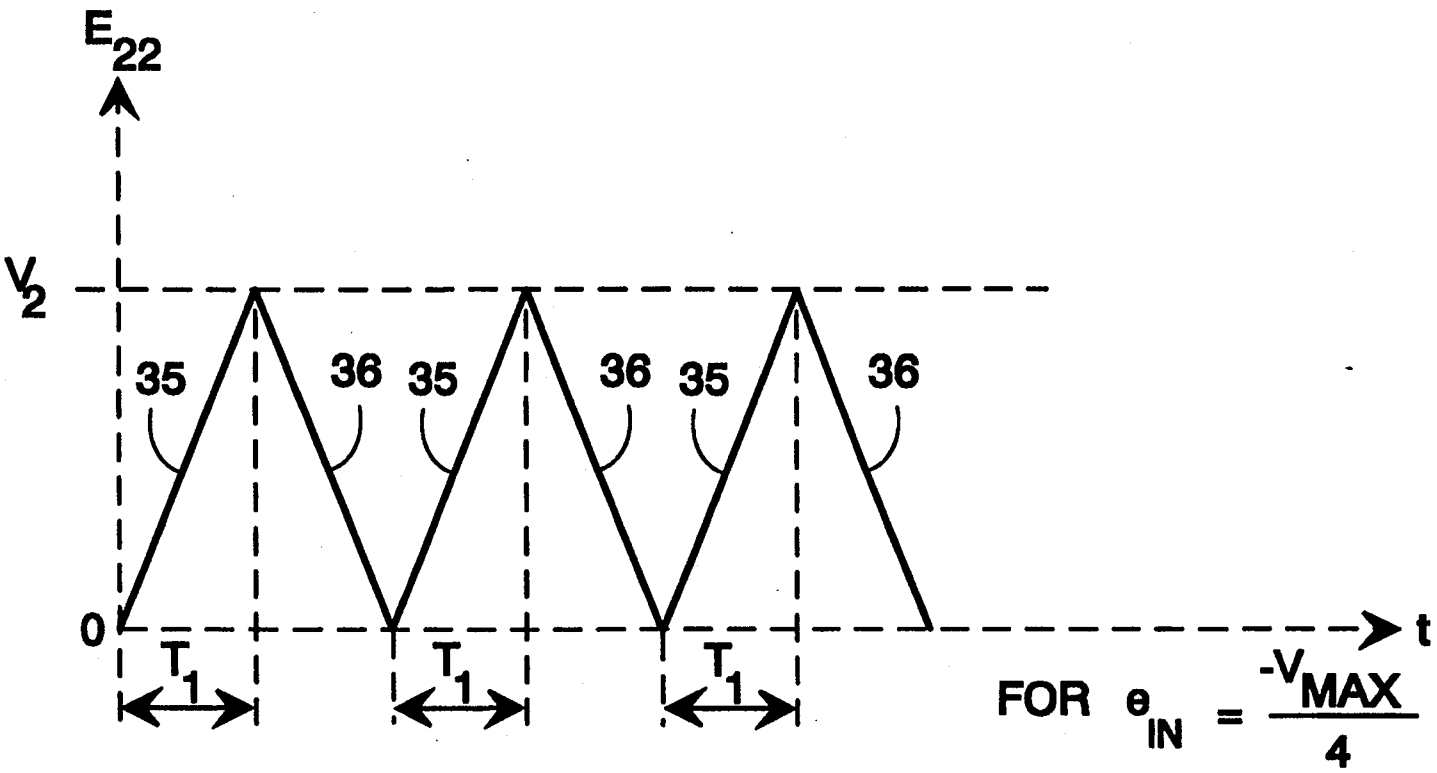

The triangular waveforms derived by amplifier 22 within voltage-to-frequency converter 13 in response to output voltages from source 11 being equal to Vmax/4 and — Vmax/4 are illustrated in FIGS. 3(a) and 3(b), respectively. While switch 26 is closed, capacitor 23 is linearly charged as indicated by wave segment 33 in FIG. 3(a) at a rate determined by the value of (127—Vmax/4R21−Vmax/R120), where I27 is the current from source 27 and the output of amplifier 22 increases for a predetermined time T1 equal to the time interval while the one-shot 25 is deriving a binary one output After time T1 has expired, the output voltage of amplifier 22 linearly decreases from V1 to zero, as indicated by waveform segment 34. The slope of waveform segment 34 is determined solely by the value of (−Vmax/4R21−Vmax/R120). From the foregoing, it is appreciated that the duration of waveform segment 34 is variable, and is the primary determinant of the frequency of the triangular wave output derived by amplifier 22 and the frequency of pulses derived from one-shot 25.

If the voltage of source 11 changes while the polarity of the source remains positive, the maximum voltage of the triangular wave and the frequency of the triangular wave also change. As the magnitude of the positive voltage of source 11 decreases, the maximum voltage of the triangular wave increases, accompanied by a slight increase in the slope of the positive going wave segment 33 and a significant decrease in the slope of the negative going wave segment 34. Thus, segment 34 requires a greater time to reach zero volt, reducing the frequency of the triangular waveform shown. Because the time interval spanned by wave segment 33 is constant and determined by one-shot 25, the slope of segment 33 does not affect the frequency of the waveform directly. However, the less steep slope of segment 34 causes it to reach the predetermined level of its completion later, resulting in a longer period of the waveform and a lower frequency. Therefore, as the magnitude of the positive voltage of source 11 decreases, the frequency of the triangular wave decreases, despite the constant interval of positive going wave segment 33.

Now consider the triangular wave output of amplifier 22 in response to source 11 deriving a negative output voltage having a magnitude Vmax/4, as illustrated in FIG. 3(b). During the charge portion of each cycle, as indicated by straight line waveform segment 35, switches 26 and 29 are closed, whereby the net current flowing to the inverting input terminal of amplifier 22 from sources 11, 27 and 28 is (−Vmax/4R21−I27+Vmax/R120+Vmax/R121), where Vmax/R121 is the current that flows from reference voltage source 28 through resistor 121 and switch 29. Since I27 is much greater than all the other currents together, the output voltage of amplifier 22 increases linearly from zero value for a predetermined length of time determined by one-shot 25 at a slope determined by the net current, as indicated by wave segment 35. In response to switch 26 being opened in response to the expiration of time interval T1, the capacitor 23 is discharged to zero volt at a linear rate determined by (−Vmax/4R21+Vmax/R120+Vmax/R121), whereby the slope of negative going linear discharge segment 36 in FIG. 3(b) is greater than the slope of waveform segment waveform 34 in FIG. 3(a). Waveform segment 36 continues until a zero level is detected by comparator 24, causing triggering of one-shot 25 to close switch 26, completing the cycle. Because of the larger slope of waveform segment 36 than waveform segment 34, the frequency of the triangular wave output of amplifier 22 and of pulses derived by one-shot 25 is greater for the voltage of source 11 being −Vmax/4 than for the voltage of source 11 being +Vmax/4.

Polarity detector 14 includes a voltage comparator 41 having a signal input terminal connected to be responsive to the output of bipolar analog voltage source 11 and a second, grounded input terminal. In response to the input voltage to comparator 41 from source 11 being equal to or greater than zero, the comparator derives a binary zero output level; in response to the voltage of source 11 being negative, comparator 41 derives a binary one output level.

The binary level derived by comparator 41 is sampled by D flip flop 42 once, shortly after the voltage from source 11 has been applied but before the frequency-to-digital converter 16 has begun counting the output frequency of the converter 13. The Q output of flip-flop 42 is supplied as a control signal for switch 29 and as a polarity bit to frequency-to-digital converter 16.

Frequency to digital converter 16 includes a counter 50 which counts the frequency of a local oscillator 61 that operates at a much higher frequency than the maximum frequency from the voltage-to-frequency converter 13, e.g., 40 MHz and counter 51 which counts the pulses from one-shot 25. Counter 50 begins counting high frequency clock pulses immediately after a high-to-low transition of the output of one-shot 25, responding to a predetermined number of clock pulses to establish a minimum sample time. During that sample time, counter 51 counts subsequent high-to-low transitions of one-shot 25. At the end of the predetermined sample time, counter 50 is reset to zero, or simply "rolls over", and begins counting up again. The counter 50 continues counting until the next high-to-low transition of the output of one-shot 25, which stops both counters 50 and 51. At this time, counter 51 contains a number which corresponds to an exact number of frequency cycles of the voltage-to-frequency converter, while counter 50 contains a number which will be added to the predetermined number at which counter 50 was reset to zero, to determine the length of time required for the whole number of voltage-to-frequency cycles to occur. By dividing the number of cycles from counter 51 by the length of time required for those cycles from counter 50, the frequency of the voltage-to-frequency converter is determined with a high degree of resolution within a few cycles. This method could be used with very high local oscillator frequency to obtain the desired frequency data within one cycle of the voltage-to-frequency converter. In practice, this is limited by phase noise of the voltage-to-frequency converter 13 and the maximum clock frequency at which counter 50 operates.

Division of the number of cycles from counter 51 by the length of time derived by counter 50 may be performed either in hardware or in software. The polarity bit is then mathematically combined with the result of the division to map the frequency into the correct positive or negative number corresponding to the voltage provided by source 11. Again, this mapping may be done in either hardware or software. Once this mapping is done, the polarity bit and the number corresponding to the voltage magnitude are available as a reading of the input voltage from source 11.

While there has been described one specific embodiment of the invention, it will be clear that variations in the details of the embodiment specifically illustrated and described may be made without departing from the true spirit and scope of the invention as defined in the appended claims.

We claim:

1. A circuit for converting an input voltage having first and second opposite polarities to an output frequency wherein the output frequency is related to the value of the input voltage, the input voltage value including zero, the output frequency having a non-zero value for a zero input value, comprising a capacitor;

means responsive to the input voltage for cyclically charging the capacitor in first and second opposite directions so that zero net charge is applied to the capacitor during each cycle, the means for charging including means for charging the capacitor (a) in the first direction at a first rate determined by the value of the input voltage and a predetermined current while the input voltage has the first polarity, (b) in the second direction at a second rate determined by the value of the input voltage while the input voltage has the first polarity, (c) in the first direction at a third rate determined by the value of the input voltage, a predetermined voltage and the predetermined current while the input voltage has the second polarity and (d) in the second direction at a fourth rate determined by the value of the input voltage, the predetermined voltage while the input voltage has the second polarity, the predetermined voltage and predetermined current being of opposite polarity; and means responsive to the charging and discharging of the capacitor for deriving the output frequency.

2. The circuit of claim 1 wherein the means for cyclically charging includes: means for supplying a predetermined constant current having the second polarity to the capacitor while the capacitor is being charged in the second direction for a predetermined interval during each cycle and means for supplying a preset constant current having the first polarity to the capacitor throughout each cycle while the input voltage has the second polarity, the magnitude of the predetermined current being equal to the maximum current flowing from the source of the input voltage to the capacitor, the magnitude of the predetermined current exceeding the magnitude of a maximum current derived from the predetermined voltage.

3. The circuit of claim 1 further including means for sensing the polarity of the input voltage at a predetermined time, said voltage polarity sensing means being connected to said charging means to control whether the capacitor is charged at the first and second rates or at the third and fourth rates.

4. A circuit for converting an input voltage having first and second opposite polarities to an output frequency wherein the output frequency is related to the value of the input voltage, the input voltage value including zero, the output frequency having a non-zero value for a zero input voltage value, comprising a charge balanced voltage to frequency converter responsive to the input voltage, and means responsive to the input voltage having the first and second polarities for supplying a predetermined bias voltage having the first polarity only when the input voltage is at the second polarity.

5. An analog to digital converter responsive to an input voltage source having first and second polarities and a predetermined amplitude range, comprising means for converting the input voltage into an output frequency, the output frequency varying as a function of the amplitude and polarity of the input voltage such that there is a step function change in the output frequency with changes in polarity of the input voltage, the output frequency having the same value for two different magnitudes and polarities of the input voltage, and means responsive to the polarity of the input voltage and the output frequency for deriving a digital signal having different values for different voltages throughout the range.

6. The converter of claim 5 wherein the means for converting includes a charge balanced voltage to frequency converter responsive to the input voltage, and means responsive to the input voltage having the first and second polarities respectively causing first and second polarity currents to flow to the converter and for selectively supplying a predetermined bias current having a first polarity to the converter.

7. The converter of claim 5 wherein the means for converting includes a capacitor;

means responsive to the input voltage for cyclically charging the capacitor in first and second opposite directions so that zero net charge is applied to the capacitor during each cycle, the means for charging including means for charging the capacitor (a) in the first direction at a first rate determined by the value of the input voltage and a predetermined current while the input voltage has the first polarity, (b) in the second direction at a second rate determined by the value of the input voltage while the input voltage has the first polarity, (c) in the first direction at a third rate determined by the value of the input voltage, a predetermined voltage and the predetermined current while the input voltage has the second polarity and (d) in the second direction at a fourth rate determined by the value of the input voltage, the predetermined voltage while the input voltage has the second polarity, the predetermined voltage and predetermined current being of opposite polarity; and means responsive to the charging and discharging of the capacitor for deriving the output frequency.

8. The converter of claim 7 wherein the means for cyclically charging includes: means for supplying a predetermined constant current having the second polarity to the capacitor while the capacitor is being charged in the second direction for a predetermined interval during each cycle and means for supplying a preset constant voltage having the first polarity to the capacitor throughout each cycle while the input voltage has the second polarity, the magnitude of the predetermined voltage being equal to the maximum current flowing from the source of the input voltage to the capacitor, the magnitude of the predetermined current exceeding the magnitude of a maximum current derived from the predetermined voltage.

9. The converter of claim 7 further including means for sensing the polarity of the input voltage, said voltage polarity sensing means being connected to said charging means to control whether the capacitor is charged at the first and second rates or at the third and fourth rates and means for controlling the digital signal deriving means so that the output frequency is sampled at a predetermined rate.

10. Apparatus for converting a bipolar analog input voltage into a digital signal, comprising a polarity sensor responsive to the analog input voltage, a voltage-to-frequency converter responsive to the polarity sensed by the polarity sensor and the analog input signal for deriving a variable frequency signal having double values of frequency as a function of the magnitude of the analog input signal and its polarity and a discontinuity in the frequency derived thereby as the analog input signal changes polarity, a frequency-to-digital converter responsive to the variable frequency output of the voltage-to-frequency converter and of the polarity sensor for deriving a digital signal having a polarity bit indicative of the sensed polarity and additional bits controlled by the frequency derived by the voltage-to-frequency converter and the sensed polarity.

11. The apparatus of claim 10 wherein the voltage-to-frequency converter comprises a charge balanced voltage-to-frequency converter, a reference voltage source, and means responsive to the sensed polarity for selectively supplying current derived from the reference voltage source to the charge balanced voltage-to-frequency converter as a function of the sensed polarity.

12. The apparatus of claim 11 wherein the charge balanced voltage-to-frequency converter includes a constant current source selectively connected to an integrating capacitor of the voltage-to-frequency converter during a portion of each cycle of the converter, the voltage-to-frequency converter including impedance means connected to a source of the analog input voltage and the analog input voltage having a maximum magnitude such that a maximum predetermined current derived from the analog input voltage is supplied to the voltage-to-frequency converter, the polarity of the current supplied to the converter by the reference voltage source being different from the polarity of the current supplied to the voltage-to-frequency converter derived from the constant current source, the magnitude of the current supplied to the voltage-to-frequency converter by the constant current source being greater than the sum of the current supplied to the voltage-to-frequency converter by the reference voltage source plus the current derived by the analog input voltage source.

13. A circuit for converting an input voltage having first and second opposite polarities to a digital representation of the input voltage, the input voltage having positive and negative values as well as zero, the digital representation being double valued such that (a) said representation increases from a low value to a high value as the input voltage of the first polarity increases from zero to a full scale value, (b) the digital representation decreases from said high value to said low value as the input voltage of the second polarity increases from zero to said full scale value and (c) a polarity signal is generated indicating which state (a) or (b) applies, said circuit comprising:

means for converting input voltages of the first polarity to corresponding digital representations;

a plurality of sensing elements responsive to said input voltage for generating said polarity signal;

a source of a bias voltage equal to said full scale input voltage of the first polarity; and means for summing (1) a signal derived from the bias voltage with (2) a signal derived from the input voltage, when the input voltage is of the second polarity.

* * * * *